US011126565B2

United States Patent
Benedict

(10) Patent No.: US 11,126,565 B2
(45) Date of Patent: Sep. 21, 2021

(54) ENCRYPTED MEMORY ACCESS USING PAGE TABLE ATTRIBUTES

(71) Applicant: Hewlett Packard Enterprise Development LP, Houston, TX (US)

(72) Inventor: Melvin K. Benedict, Magnolia, TX (US)

(73) Assignee: Hewlett Packard Enterprise Development LP, Houston, TX (US)

(*) Notice: Subject to any disclaimer, the term of this patent is extended or adjusted under 35 U.S.C. 154(b) by 323 days.

(21) Appl. No.: 15/193,146

(22) Filed: Jun. 27, 2016

(65) Prior Publication Data

US 2017/0371809 A1    Dec. 28, 2017

(51) Int. Cl.
*G06F 12/14* (2006.01)
*G11C 7/24* (2006.01)
*G11C 29/44* (2006.01)

(52) U.S. Cl.
CPC .......... *G06F 12/1408* (2013.01); *G11C 7/24* (2013.01); *G06F 12/1475* (2013.01); *G06F 2212/1052* (2013.01); *G06F 2212/402* (2013.01); *G11C 2029/4402* (2013.01)

(58) Field of Classification Search
CPC .......... G06F 11/073; G06F 11/079; G06F 12/1009; G06F 12/1475; G06F 2212/402; G06F 2212/1052; G06F 12/1408; G11C 7/24; G11C 2029/4402
USPC .......................................................... 713/193
See application file for complete search history.

(56) References Cited

U.S. PATENT DOCUMENTS

| 7,849,510 | B2 | 12/2010 | Danilak et al. |
| 9,049,005 | B2 | 6/2015 | Cho et al. |
| 2006/0156418 | A1* | 7/2006 | Polozoff ............. H04L 63/0428 726/28 |
| 2007/0192592 | A1* | 8/2007 | Goettfert ............. G06F 12/1408 713/162 |
| 2008/0107275 | A1 | 5/2008 | Asnaashari et al. |
| 2011/0154061 | A1 | 6/2011 | Chilukuri et al. |
| 2011/0161620 | A1* | 6/2011 | Kaminski ........... G06F 12/1009 711/207 |

(Continued)

OTHER PUBLICATIONS

Maletsky, K.; "Protect and control software stored in Dash memory"; Jul. 20, 2010; 7 pages.

*Primary Examiner* — Samson B Lemma
*Assistant Examiner* — Zoha Piyadehghibi Tafaghodi
(74) *Attorney, Agent, or Firm* — Sheppard Mullin Richter & Hampton LLP

(57) ABSTRACT

Encrypted memory access using page table attributes is disclosed. One example is a memory system including a memory controller at a memory interface. The memory controller includes an encryptor to control a plurality of memory access keys respectively associated with memory regions, where each memory region is allocated to a respective client, and an access manager to receive an access request from a client, the access request including a client access key to access a memory element. The access manager looks up a memory access key from a page table attribute associated with a physical address of the memory element, and determines if the access request is valid by comparing the client access key with the memory access key associated with the memory region that includes the memory element. Based on the determination and a mode of operation, the access manager provides a response to the access request.

18 Claims, 4 Drawing Sheets

(56) References Cited

U.S. PATENT DOCUMENTS

| | | | |
|---|---|---|---|
| 2014/0032904 A1* | 1/2014 | Margalit | H04L 63/0428 713/168 |
| 2014/0164793 A1* | 6/2014 | Hadley | G06F 21/54 713/193 |
| 2014/0181454 A1* | 6/2014 | Manula | G06F 12/0223 711/170 |
| 2015/0033035 A1* | 1/2015 | Haid | G06F 12/1408 713/193 |
| 2015/0046702 A1* | 2/2015 | Paaske | G06F 21/85 713/160 |
| 2015/0089247 A1* | 3/2015 | Kang | G06F 21/305 713/193 |
| 2015/0222604 A1* | 8/2015 | Ylonen | H04L 63/062 713/171 |
| 2015/0248357 A1* | 9/2015 | Kaplan | G06F 12/1408 713/193 |
| 2015/0371063 A1* | 12/2015 | Van Antwerpen | G06F 21/80 713/190 |
| 2016/0004646 A1* | 1/2016 | Maeda | G06F 21/62 713/193 |
| 2016/0041928 A1* | 2/2016 | Lesartre | G06F 12/0246 711/163 |

* cited by examiner

ENCRYPTED MEMORY ACCESS USING PAGE TABLE ATTRIBUTES

BACKGROUND

Memory regions are generally allocated to different users and/or applications. In some instances, data packets that flow between the application/user and the memory region are encrypted. In some instances, memory regions on servers are partitioned and may be associated with security protocols.

BRIEF DESCRIPTION OF THE DRAWINGS

Various examples will be described below with reference to the following figures.

DETAILED DESCRIPTION

Figure 1:
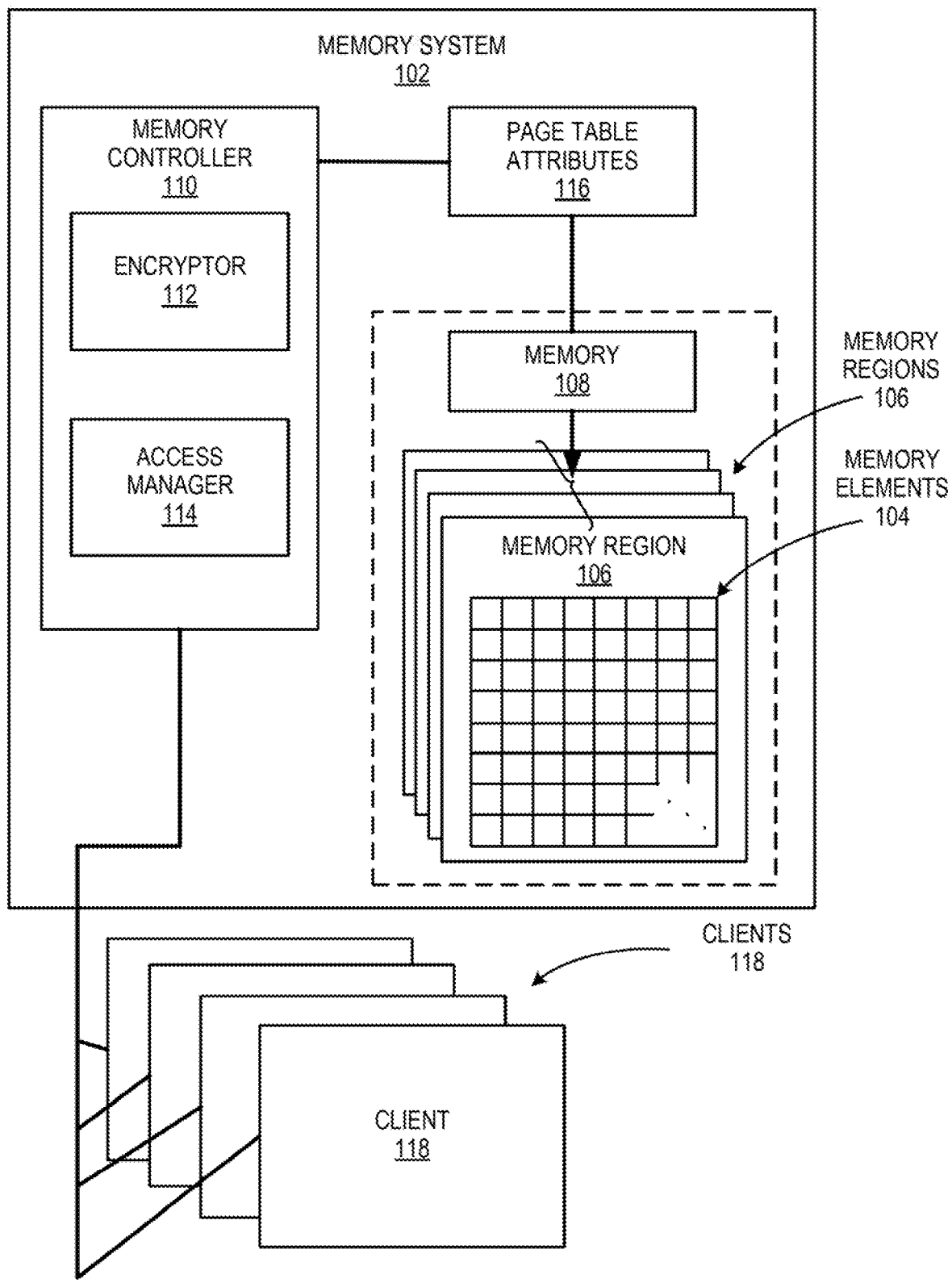
FIG. 1 is a block diagram that depicts an example memory system for encrypted memory access using page table attributes.

Memory devices may include multiple memory elements that store data. An example memory device may be a dual inline memory module (DIMM) having embedded thereon a double data rate (DDR) synchronous dynamic random-access memory (SDRAM) chip. A DIMM may have four, eight, or other numbers of DDR SDRAM chips. Each DDR SDRAM chip may include many volatile memory elements ordered into banks (arrays) of rows and columns. To read or write data (e.g., a one or zero) to a particular memory element, the corresponding row and column are activated to target the particular memory element. Some memory interface specifications, such as the DDR specifications (e.g., DDR2, DDR3, DDR4, LPDDR2, LPDDR3, LPDDR4), are designed to expect consistent (i.e., fixed) read and write timings and latencies.

Non-volatile memory (NVM) elements also may be organized into memory arrays and implemented on a memory module. Examples of non-volatile memory may include resistive random-access memory (also referred to as memristor memory), phase change memory, spin-transfer torque memory, or other types of persistent or non-volatile memory.

In general, memory regions on servers are partitioned and may be associated with security protocols. However, with shared memory resources, such partitions may be less rigid, and memory regions may sometimes be merged. Existing memory systems have little to no isolation between memory regions allocated to different users or applications. However, it is desirable to maintain a strong isolation between applications and/or users that access such shared memory resources. Although page table entries (PTEs) may be utilized to provide some isolation, such protection is relatively not secure, and may generally not be able to prevent rogue access.

The techniques described herein improve protection between memory regions that are allocated to different clients, such as users, applications, processes, drivers etc.

Although various forms of encryption may be available on processors, encryption at the memory interface is generally not provided. The memory controller at the memory interface may be designed to provide increased isolation and security. Implementation would have little impact on memory system performance because the encryption and error correction algorithms are similar to existing techniques, and the memory controller design could combine the error correcting code (ECC) function and encryption function into a single logical element.

As described herein, a security protocol resides at the memory interface and comprises a number of keys that are uniquely associated with memory regions that may be made accessible to clients. Each client provides an access key and a memory address and the memory controller determines if the security protocol for an appropriate memory region is breached. In some examples, scrambled data may be sent back to the application or user if a breach is determined to have occurred. Other actions may include updating the security protocol to account for new clients.

As described in various examples herein, encrypted memory access using page table attributes is disclosed. One example is a memory system including memory elements organized into memory regions, and a memory controller at a memory interface. The memory controller includes an encryptor to control a plurality of memory access keys respectively associated with the memory regions, where each memory region is allocated to a respective client, and an access manager to receive an access request from a client, the access request including a client access key to access a memory element. The access manager looks up a memory access key from a page table attribute associated with a physical address of the memory element, and determines if the access request is valid by comparing the client access key with the memory access key associated with the memory region that includes the memory element. Based on the determination and a mode of operation, the access manager provides a response to the access request.

In the following detailed description, reference is made to the accompanying drawings which form a part hereof, and in which is shown by way of illustration specific examples in which the disclosure may be practiced. It is to be understood that other examples may be utilized, and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

FIG. 1 is a block diagram that depicts an example memory system 102 for encrypted memory access using page table attributes. System 102 includes a memory 108, with memory elements 104 organized into memory regions 106. System 102 includes a memory controller 110 between the memory 108 and client 118, and the memory controller 110 includes an encryptor 112, and an access manager 114.

The memory controller 110 may be any combination of hardware and programming to implement their respective functionalities as described herein. In some examples, such combinations of hardware and programming may be implemented in a number of different ways. For example, the programming may be logic to implement processor executable instructions stored on a non-transitory machine readable storage medium and the hardware for the components may include a processing resource to retrieve and/or execute those instructions. For example, the processing resource may be a microcontroller, a microprocessor, central processing unit core(s), an application-specific integrated circuit (ASIC), a field programmable gate array (FPGA), and/or other hardware device suitable for retrieval and/or execution of configuration data from the machine readable storage medium. Additionally or alternatively, the memory controller 110 may include one or more hardware devices including electronic circuitry or logic for implementing functionality described herein.

The memory elements 104 store data, such as ones or zeroes, although other data values may be stored in some implementations. The memory elements 104 may be, for example, volatile memory elements or non-volatile memory elements (based on technologies such as, for example, memristor, phase change memory, spin-transfer torque memory, etc.). The memory elements 104 may be organized into memory regions 106. In some implementations, the memory elements 104 are arranged in a cross-point array (or multiple cross-point arrays) included in a memory region 106.

Generally, as described herein, the components of system 102 may include software programming and physical networks to be communicatively linked to other components of system 102. In some instances, the components of system 102 may include a processor and a memory, while programming code is stored on that memory and executable by a processor to perform designated functions.

Memory 108 can be any type of memory device including but not limited to synchronous dynamic random access memory (SD RAM), dynamic random access memory (DRAM), non-volatile memory (NVM) any combination of memory technologies, and the like.

The memory controller 110 may be positioned at a memory interface between the memory 108 and clients 118. The memory controller 110 may comprise a logic circuit that may be programmable to implement a security protocol. Generally, as described herein, the memory controller 110 is designed to have the ability to manage multiple client access keys/memory access keys, thereby enabling development of more secure platforms, and increasing isolation between various clients 118 (e.g., applications and users) that are utilizing shared memory resources on servers. The memory controller 110 includes an encryptor 112 to control a plurality of memory access keys respectively associated with the memory regions 106, where each memory region 106 is allocated to a respective client 118. The term "control", as used herein, includes a capability to encrypt and/or decrypt, update page table entries, and otherwise secure access to components of memory 108.

In some examples, client 118 may be a user, an application, a process, a driver, a multiprocessor with virtualized clients, and/or a combination thereof. Each client 118 is allocated a memory region 106, and is associated with a unique memory access key that authorizes access of the client 118 to the allocated memory region 106. Generally, the memory regions 106 may be accessed by a plurality of different clients. The encryptor 112 is configured to simultaneously control memory access by the plurality of different clients. Although there is a physical limitation on a number of active keys, the encryptor 112 may be designed to manage an unlimited number of keys in the platform, and so an unlimited number of clients 118 may be isolated from each other.

In some examples, the encryptor 112 may perform functions related to encryption and decryption of data flow between clients 118 and the memory 108. In some instances, as described herein, the encryptor 112 may provide unencrypted data from memory 108 to client 118. Also, when an access request is determined to be not valid, the encryptor 112 may scramble the data, and provide scrambled data to the clients 118. Generally, the term scrambled refers to any data manipulation that may obfuscate the real data so as to make it unavailable to the client 118.

Figure 2:
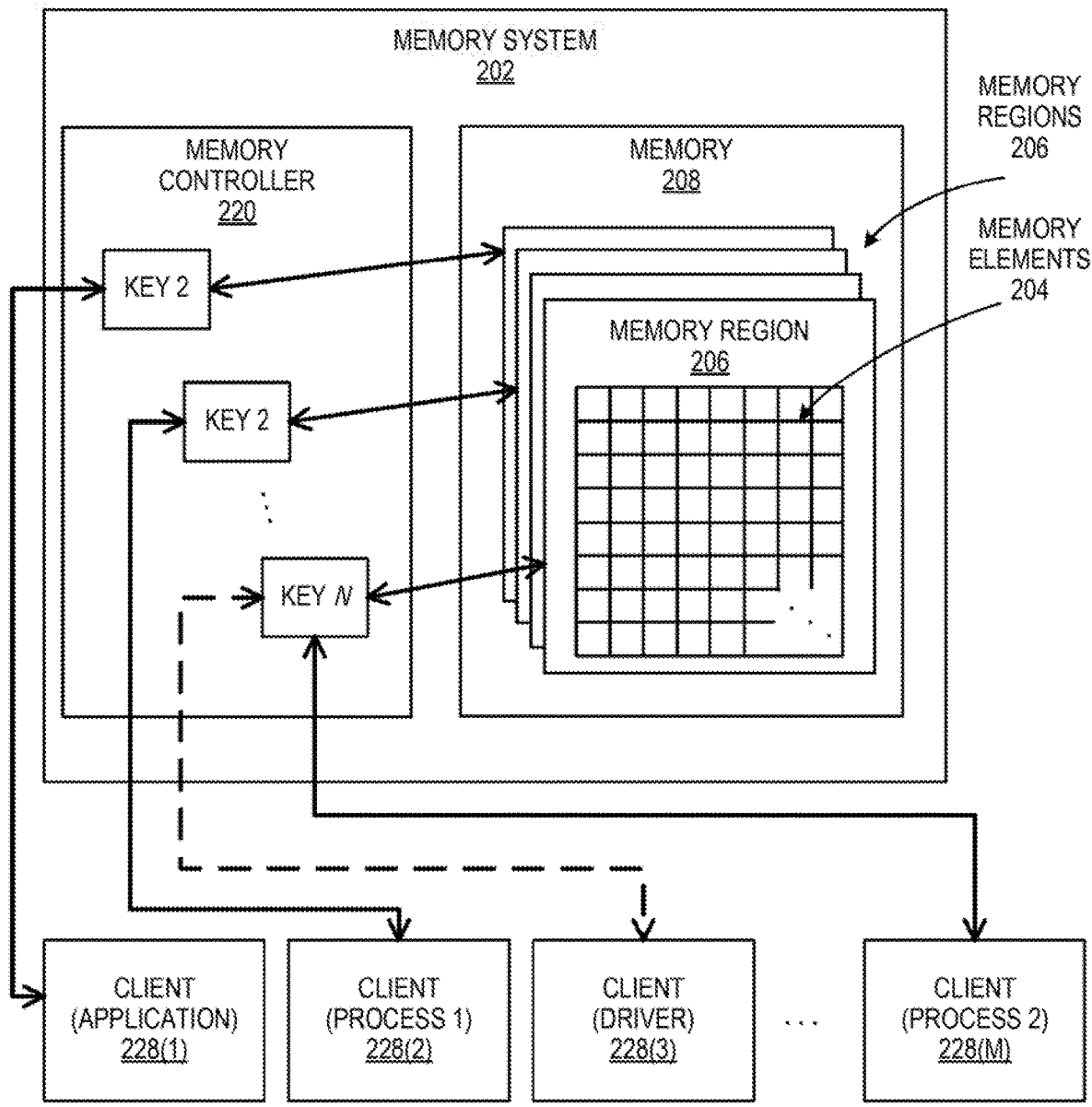
FIG. 2 is a block diagram that depicts an example memory system for encrypted memory access using unique keys to associate clients to memory regions.

FIG. 2 is a block diagram that depicts an example memory system 202 for encrypted memory access using unique keys to associate clients to memory regions. Some aspects of memory system 202 may be similar to described features of memory system 102. As illustrated, memory system 202 may include a memory controller 220 at a memory interface between a memory 208 and clients 228. Memory 208 comprises memory elements 204 organized into memory regions 206. The memory controller 220 controls a plurality of memory access keys, Key 1, Key 2, . . . , Key N. As is described herein, the memory access keys, Key 1, Key 2, . . . , Key N may be located in a page table, for example, in page table attributes 116 of FIG. 1.

Each memory access key, Key 1, Key 2, . . . , Key N, is associated with a unique memory region 206, as illustrated with the bold bi-directional arrows. The plurality of memory access keys, Key 1, Key 2, . . . , Key N control access to memory regions 206 by clients, for example, Client 228(1) which may be an application, Client 228(2) which may be a first process, Process 1, Client 228(3) which may be a driver, Client 228(M) which may be a second processor, Processor 2, and so forth. Generally, each client may be associated with a client access key that includes memory addresses of memory elements 204 in memory region 206.

In some examples, multiple clients may have access to the same and/or overlapping memory regions, but only a subset of those client accesses may be active at any given time. As illustrated via a dotted bi-directional arrow, Client 228(3) may be associated with Key N to access a corresponding memory region 206. However, Client 228(3) may be a driver that is not active. At the same time, Client 228(M), Process 2, may be an active process associated with Key N to access the corresponding memory region 206. Accordingly, although these N keys may support at most N active clients at any given moment, any number of clients, say M, where M is greater than N may be supported as well. Such a unique association provides access isolation between clients 228, supports a large number of clients, and effectively controls and manages memory access. Accordingly, an enhanced security environment is created that has minimal impact on memory access, and on operation times and/or efficiencies of services and processes.

In some examples, the plurality of memory access keys, Key 1, Key 2, . . . , Key N may be managed by a secure application and a secure OS. Such key management provides versatile and agile secure memory access capabilities. In some instances, a system manager may configure access protocols, security levels, and so forth, for each key of the plurality of keys. A number of secure features may be configured. For example, at a user level, each user may be assigned a unique key. Also, for example, at a process or application level, each process or application may be assigned a unique key. As another example, at the application level, each application may be assigned a unique key although multiple users of the same application may share the same key. In this last example, although applications may be isolated, different users of the same application may not be isolated. Such unique key assignments would enable a significant number of keys per platform. In some examples, a cache mechanism may be employed to keep the most frequently accessed table blocks in memory. Multiple cache keys may be assigned to clients 118, and the clients 118 may access the key caches simultaneously. Key cache misses may be handled in a fashion similar to existing protocols to manage page table misses. Some hardware assist in key management may be developed to implement such features.

Referring again to FIG. 1, the memory controller 110 includes an access manager 114 that receives an access request from a client 118, where the access request includes a client access key to access a memory element 104. The access manager 114 then performs a look up of a memory access key from a page table attribute 116 associated with a physical address of the memory element 106, and determines if the access request is valid by comparing the client access key with the memory access key associated with the memory region 106 that includes the memory element 104.

Generally, an access request is a request by a client 118 to access contents of memory 108. For example, client 118 may be an application performing a read and/or write operation, and client 118 may request to access memory 108 to perform the read and/or write operation. Also, for example, client 118 may be a user, and the user may request to access contents of memory 108. In platforms that support client 118, most software is written in a virtual address space, i.e., the software is written without hardcoding physical addresses into the code that is to run the software. Accordingly, when client 118 makes the access request, the virtual address has to be converted to a physical address that points to the memory element 104, and this is achieved by looking up page table attributes 116.

The memory controller 110 may function as a memory management unit (MMU) that channels all memory references, and performs the conversion of virtual memory addresses to physical addresses. In some examples, the conversion may be performed by the access manager 114. MMUs generally utilize an in-memory table of entries called a page table. The page table generally includes one page table entry (PTE) per page to map virtual page numbers to physical numbers in memory 108. A page is generally 4 kilobytes (KB) to 64 KB in size, but may be larger in some instances. Page table attributes 116 are generally an extension of a page table, and such attributes support micro-management of memory regions 106 and/or memory elements 104.

Page table attributes 116 may include usage data related to client 118. For example, the page table attributes 116 may include timestamp data about when the associated memory element 104 and/or memory region 106 was last accessed by client 118, duration of access, frequency of access, failed accesses (if any), unauthorized accesses (if any), and so forth. Page table attributes 116 may be configured to prohibit memory access to a virtual page (e.g., initiated by client 118) when no physical (random access) memory has been allocated to the virtual page. As described herein, the page table attributes 116 may be configured to prohibit memory access if client access to the memory is determined to be unauthorized.

Although FIG. 1 depicts the page table attributes 116 as being included in the memory system 102, it may be appreciated that the page table attributes 116 may be included in the memory 108, a processor, or a combination thereof. The page table attributes 116 may be cacheable or uncacheable, clean or dirty, and so forth. For example, many x86 platforms support such page table attributes 116. Also, for example, a power PC uses similar page table attributes 116. In some examples, the page table attributes 116 may include status indicators.

Page table attributes 116 may include the memory access keys that secure access to different memory regions 106. For example, each memory region 106 may have a different memory access key embedded in the page table. Memory regions 106 may be associated with client 118. For example, the page table entries include memory access keys that are associated with the client 118, and the access request to access memory 108 would have the appropriate client access key that is compatible with the memory access key for a target memory region 106 that needs to be accessed by client 118. For example, if client 118 is a process, then there may be an associated process ID (a client access key) at the OS level that has a corresponding memory access key in the page table that points to the memory region or regions 106 allocated to the process.

Accordingly, different memory regions 106 may be associated with different client access keys. When the access manager 114 receives an access request from the client 118, it looks up a memory access key from the page table attributes 116 associated with a physical address of the memory element 104. For example, the request to access memory 108 may provide a client access key that maps to the appropriate memory access key embedded in the page table attributes 116, and the access manager 114 may respond to the access request by looking up the memory access key embedded in the page table attributes 116 that is associated with the received client access key. For example, client 118 may be a processor with an associated process identifier at the operating system (OS) level, and the process identifier may be associated with an appropriate memory access key embedded in the page table attributes 116. When the access manager 114 receives an access request from the client 118, it looks up the appropriate memory access key associated with the process identifier.

In some examples, the encryptor 112 may control N memory access keys, for example, N=15, that include encryption information for access to N unique memory regions 108. The access request includes a client access key and memory address data. The client access key may include a process identifier, a thread identifier, an application identifier, and a context definition. A context generally refers to a local status of a platform. The context definition provides information as to which application, processor, virtual system identifier, etc. is currently associated with the current status of the platform. The context definition generally changes every cycle, and so the client access keys may be updated every cycle, and access to the memory 102 may therefore be effectively controlled by the memory controller 110 by enabling and/or disabling access based on the context definition.

The access manager 114 determines if the access request is valid by comparing the client access key with the memory access key associated with the memory region that includes the memory element. If it is determined that the client access key corresponds to the memory access key, access for client 118 is enabled, and client 118 is able to access the requested memory element 104 in memory region 106. However, If it is determined that the client access key fails to correspond to the memory access key, access for client 118 is not enabled.

In some examples, to determine that the access request is not valid, the access manager 114 may identify a page table miss in a page table that includes the page table attribute. A page table miss may occur due to a missing entry in the page table, or due to a page fault. A page fault is a type of interrupt raised by computer hardware when there is an attempt to access a memory page that is mapped into the virtual address space, but not actually loaded into main memory. Based upon the identified page table miss, access may be denied to the client 118 that sends the access request. In some examples, based upon the identified page table miss, the access manager 114 may determine that the memory element 104 is now accessible to a new client, and the encryptor 112 may update the memory access key to conform to a new client access key associated with the new client. For example, the encryptor 112 may update the page table attributes 116 to reflect updated access restrictions for the new client.

In some examples, the access manager 114 may provide a response to the access request based on the determination and a mode of operation. A plurality of modes of operation may be enabled, including, for example, isolation only, encryption and error correction only, and a combination thereof.

In some examples, the mode of operation may be isolation only, and the access manager 114 may determine that the access request is valid, and the encryptor 112 may provide unencrypted data to the client 118. Likewise, in some examples, the access manager 114 may determine that the access request is not valid, and the encryptor 112 may provide scrambled data to the client 118.

In some examples, when the mode of operation is encryption and error correction only, the encryptor 112 may perform routine encryption and error correction functions. In some examples, the access manager 114 may generate an alert that a fatal uncorrectable memory error has occurred.

In some examples, when the mode of operation is a combination of isolation, encryption and error correction functions, the access manager 114 may determine that the access request is valid and the encryptor 112 may provide unencrypted data to the client 118. Similarly, the access manager 114 may determine that the access request is not valid, and the encryptor 112 may provide scrambled data to the client 118, and the access manager 114 may also generate an alert that a fatal uncorrectable memory error has occurred. In case of an uncorrectable memory error, the hardware and part of the hardware setup may be identified as targets of the error, and may be suitably isolated. For example, based on the alert, an interrupt may be generated whereby the OS queries appropriate results registers and makes a decision based, for example, on a predetermined decision tree, as to how to rectify the uncorrectable memory error. For example, an entire system may be shut down. As another example, the interrupt to the OS may isolate an unauthorized application and terminate it, or isolate an unauthorized process and kill it. Also, for example, memory access to certain memory regions 104 may be restricted, and/or prohibited.

Generally, 118 upon a determination that the access request is not valid, the access manager 114 may respond in several ways. In some instances, as described herein, the access manager 114 may provide scrambled data to the client 118. Also, for example, the access manager 114 may generate an interrupt. As another example, the access manager 114 may generate a trap in a manner similar to an invalid op detection mechanism. Also, as described herein, the access manager 114 may generate an alert that a fatal uncorrectable memory error has occurred.

In some examples, an impending backup of a non-volatile dual inline memory module (NVDIMM) may cause the memory controllers to react on all memory channels. This may present significant performance issues if demand backup is implemented on the platform. However, based on the techniques provided herein, an alert may be generated to add resources to the memory controller 110 and the NVDIMM that develops control structures to clear the data path from the memory controller 110 to the NVDIMM.

System 102 (or system 202) may be implemented by a computing device. A computing device, as used herein, may be, for example, a web-based server, a local area network server, a cloud-based server, a notebook computer, a desktop computer, an all-in-one system, a tablet computing device, a mobile phone, an electronic book reader, or any other electronic device suitable for provisioning a computing resource to perform secured memory access. The computing device may include a processor and a computer-readable storage medium. In examples described herein, a processing resource may include, for example, one processor or multiple processors included in a single computing device or distributed across multiple computing devices. The components of system 102 (e.g., 104, 106, 108, 110, 112, 114, 116) may be any combination of hardware and programming to implement the functionalities described herein. In examples described herein, such combinations of hardware and programming may be implemented in a number of different ways. For example, the programming for the components may be logic to implement processor executable instructions stored on at least one non-transitory machine-readable storage medium and the hardware for the components may include at least one processing resource to execute those instructions. In some examples, the hardware may also include other electronic circuitry to at least partially implement at least one component of system 100. In some examples, the at least one machine-readable storage medium may store instructions that, when executed by the at least one processing resource, at least partially implement some or all of components 104, 106, 108, 110, 112, 114, 116 of system 102. In such examples, system 102 may include the at least one computer readable storage medium storing the instructions and the at least one processing resource to execute the instructions. In other examples, the functionalities of any components of system 102 may be at least partially implemented in the form of electronic circuitry.

Figure 3:
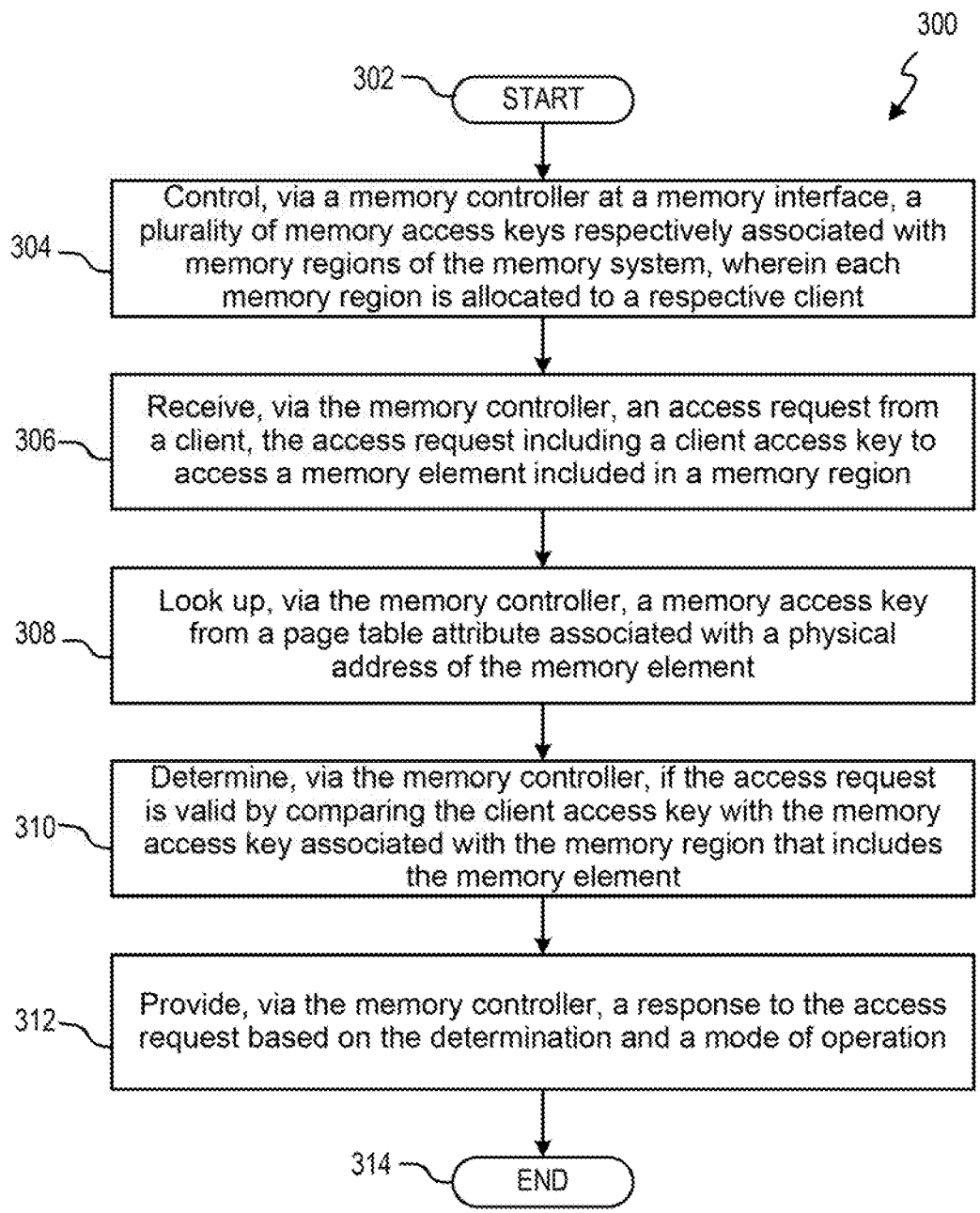
FIG. 3 is a flowchart of an example method for encrypted memory access using page table attributes.

FIG. 3 is a flowchart of an example method for encrypted memory access using page table attributes. In some examples, such an example method may be implemented by a system such as, for example, system 102 of FIG. 1, and/or system 202 of FIG. 2. The method 300 may begin at block 302, and continue to block 304.

At 304, a plurality of memory access keys respectively associated with memory regions of the memory system are controlled via a memory controller, where each memory region is allocated to a respective client.

At 306, an access request is received from a client via the memory controller, the access request including a client access key to access a memory element included in a memory region.

At 308, a memory access key from a page table attribute associated with a physical address of the memory element is looked up via the memory controller.

At 310, it is determined, via the memory controller, if the access request is valid, by comparing the client access key with the memory access key associated with the memory region that includes the memory element.

At 312, a response to the access request is provided based on the determination and a mode of operation.

The method 300 ends at block 314.

In some examples, the method 300 may include determining that the access request is not valid by identifying a page table miss in the page table.

In some examples, the method 300 may include determining that the memory element is accessible to a new client; and updating the memory access key to conform to a new client access key associated with the new client.

In some examples, the mode of operation may be isolation only, and the method 300 may include providing unencrypted data to the client upon a determination that the access request is valid, and providing scrambled data to the client upon a determination that the access request is not valid.

In some examples, the mode of operation may be encryption and error correction only, and the method 300 may include performing the encryption and error correction functions.

In some examples, the method 300 may include identifying an unauthorized access request from a client; and restricting access to the memory region associated with the unauthorized access request.

Figure 4:
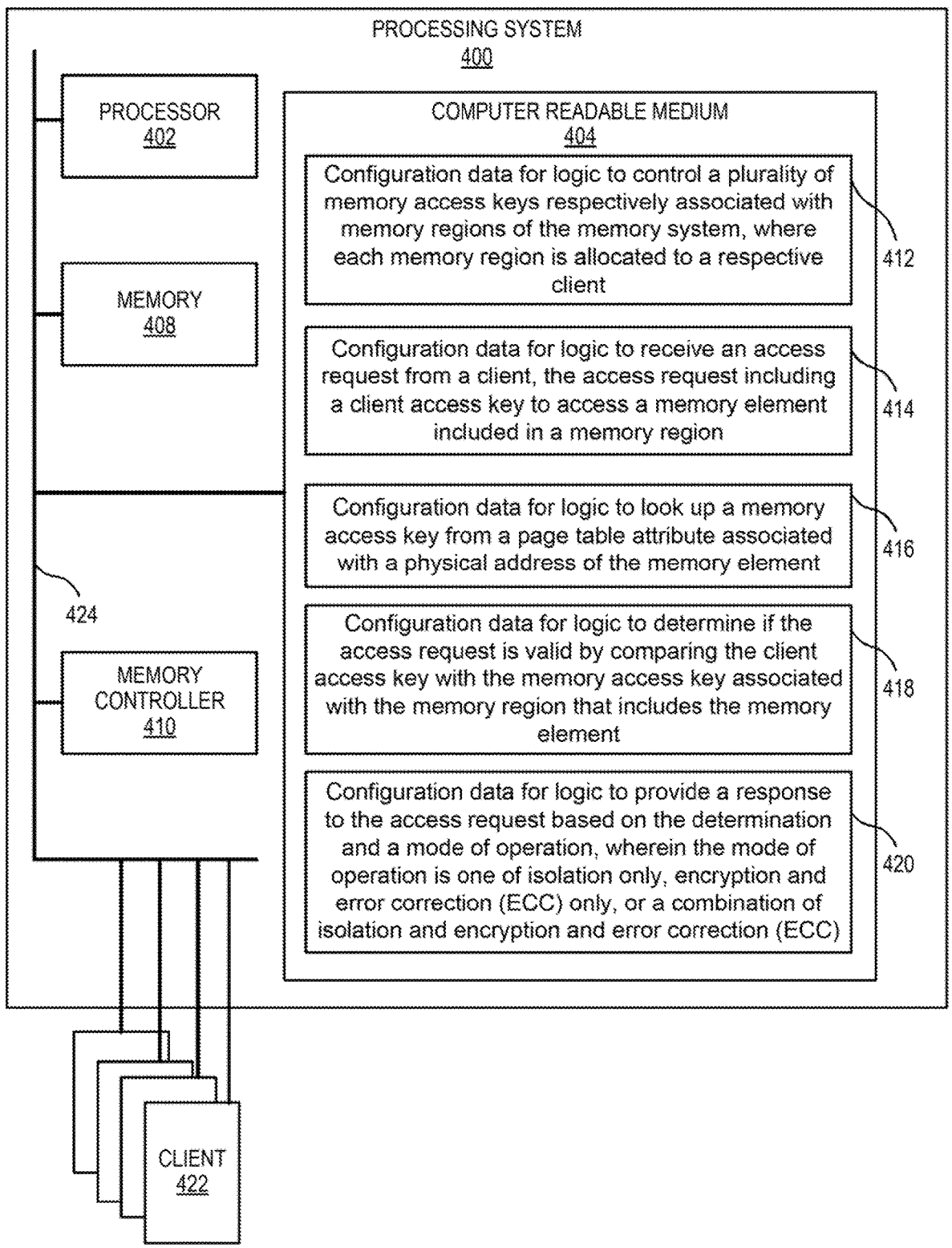
FIG. 4 is a block diagram of an example programmable memory controller comprising logic to enable the memory controller to manage encrypted memory access using page table attributes.

FIG. 4 is a block diagram of an example programmable memory controller comprising logic to enable the memory controller to manage encrypted memory access using page table attributes. In some examples, a non-transitory, computer readable medium 404 may store configuration data for the logic to perform the various functions of the memory controller 410. The memory controller 410 and the computer readable medium 404 may be a part of a processing system 400 that includes a processor 402, and a memory 408. Processor 402, computer readable medium 404, memory 408, and memory controller 410 are coupled to each other through a communication link (e.g., a bus) 424. A plurality of clients 422 may be coupled to the processing system 400. In some instances, the plurality of clients 422 may be coupled to the memory controller 410 via input and output devices.

Processor 402 executes instructions included in the computer readable medium 404 that stores configuration data for logic to enable the memory controller 410 to perform the various functions. Computer readable medium 404 stores configuration data for logic 412 to control a plurality of memory access keys respectively associated with memory regions of the memory system, wherein each memory region is allocated to a respective client.

Computer readable medium 404 stores configuration data for logic 414 to receive an access request from a client, the access request including a client access key to access a memory element included in a memory region.

Computer readable medium 404 stores configuration data for logic 416 to look up a memory access key from a page table attribute associated with a physical address of the memory element.

Computer readable medium 404 stores configuration data for logic 418 to determine if the access request is valid by comparing the client access key with the memory access key associated with the memory region that includes the memory element.

Computer readable medium 404 stores configuration data for logic 420 to provide a response to the access request based on the determination and a mode of operation, wherein the mode of operation is one of isolation only, encryption and error correction only, or a combination of isolation, encryption error correction.

In some examples, computer readable medium 404 stores configuration data for logic to identify a page table miss in the page table; and configuration data for logic to determine that the access request is not valid based on the identified page table miss.

In some examples, computer readable medium 404 stores configuration data for logic to determine that the memory element is accessible to a new client; and configuration data for logic to update the memory access key to conform to a new client access key associated with the new client.

In some examples, computer readable medium 404 stores configuration data for logic to identify an unauthorized access request from the application; and configuration data for logic to generate an interrupt to an operating system to terminate the application.

Input devices may include a keyboard, mouse, data ports, and/or other suitable devices for inputting information into processing system 400. Output devices may include a monitor, speakers, data ports, and/or other suitable devices for outputting information from processing system 400. Client 422 may communicate with the memory controller 410 via the input and output devices to access memory 408.

As used herein, a computer readable medium may be any electronic, magnetic, optical, or other physical storage system to contain or store configuration data for logic, such as executable instructions, data, and the like. For example, any computer readable storage medium described herein may be any of Random Access Memory (RAM), volatile memory, non-volatile memory, flash memory, a storage drive (e.g., a hard drive), a solid state drive, and the like, or a combination thereof. For example, the computer readable medium 404 can include one of or multiple different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices.

As described herein, various components of the processing system 400 are identified and refer to a combination of hardware and programming configured to perform secure memory access. As illustrated in FIG. 4, the programming may be logic to implement processor executable instructions based on configuration data for logic that is stored on tangible computer readable medium 404, and the hardware may include processor 402 for executing those instructions. Thus, computer readable medium 404 may store configuration data for logic instructions that, when executed by processor 402, implement the various components of the processing system 400.

Such computer readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

Computer readable medium 404 may be any of a number of memory components capable of storing instructions that can be executed by processor 402. Computer readable medium 404 may be non-transitory in the sense that it does not encompass a transitory signal but instead is made up of one or more memory components configured to store the relevant instructions. Computer readable medium 404 may be implemented in a single device or distributed across devices. Likewise, processor 402 represents any number of processors capable of executing instructions that may be stored by computer readable medium 404. Processor 402 may be integrated in a single device or distributed across devices. Further, computer readable medium 404 may be fully or partially integrated in the same device as processor 402 (as illustrated), or it may be separate but accessible to that device and processor 402. In some examples, computer readable medium 404 may be a machine-readable storage medium.

Examples of the disclosure provide a generalized system for encrypted memory access using page table attributes. The generalized system utilizes a security protocol at the memory interface to provide improved protection between memory regions that are allocated to different clients, such as users, applications, processes, drivers.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein.

The invention claimed is:

1. A memory system comprising:
memory elements organized into memory regions;
a memory controller at a memory interface, the memory controller comprising:
an encryptor to control a plurality of memory access keys respectively associated with the memory regions, wherein each memory region is allocated to a respective client, and wherein the memory access keys are stored in page table attributes of a page table;
an access manager configured to:
receive an access request from a client, wherein the access request includes a client access key to access a memory element corresponding to a virtual address,
determine, in the page table, a physical address corresponding to the virtual address,
look up, from a page table attribute associated with the physical address a memory access key associated with the physical address,
compare the client access key with the memory access key associated with the memory region that includes the memory element, and
provide a response to the access request based on the comparison and a mode of operation,
wherein the access manager is further configured to determine that the access request is not valid by identifying a page table miss in the page table;
and wherein the client access key comprises:
at least one of a process identifier, a thread identifier and an application identifier; and
a cyclically changing context definition indicating said at least one of the process identifier, the thread identifier and the application identifier is currently associated with a current status of the memory system.

2. The memory system of claim 1, wherein the mode of operation is isolation only, and wherein the access manager is to determine one of:
the access request is valid, and the encryptor is to provide unencrypted data to the client, and
the access request is not valid, and the encryptor is to provide scrambled data to the client.

3. The memory system of claim 1, wherein the mode of operation is encryption and error correction only, and wherein the encryptor is to perform encryption and error correction functions, and wherein, upon a determination that the access request is not valid, the access manager is to generate an alert that a fatal uncorrectable memory error has occurred.

4. The memory system of claim 1, wherein the mode of operation is isolation, encryption and error correction, and wherein the access manager is to determine one of:
the access request is valid, and the encryptor is to provide unencrypted data to the client, and
the access request is not valid, and the encryptor is to provide scrambled data to the client, and wherein the access manager is to generate an alert that a fatal uncorrectable memory error has occurred.

5. The memory system of claim 1, wherein the client is one of a user, an application, a process, a driver, and a multiprocessor with virtualized clients.

6. The memory system of claim 5, wherein the client access key is unique to each client of the plurality of clients.

7. The memory system of claim 1, wherein the client access key includes one of a process identifier, a thread identifier, an application identifier, and a context definition.

8. The memory system of claim 1, wherein the memory regions comprise non-volatile shared memory.

9. The memory system of claim 1, wherein the access manager is to determine that the memory element is accessible to a new client, and wherein the encryptor is to update the memory access key to conform to a new client access key associated with the new client.

10. A method comprising:
controlling, via a memory controller at a memory interface, a plurality of memory access keys respectively associated with memory regions of the memory system, wherein each memory region is allocated to a respective client, and wherein the memory access keys are stored in page table attributes of a page table;
receiving, via the memory controller, an access request from a client, wherein the access request includes a client access key to access a memory element corresponding to a virtual address;
determining, in the page table, a physical address corresponding to the virtual address;
looking up, via the memory controller, from a page table attribute associated with the physical address, a memory access key associated with the physical address;
comparing the client access key with the memory access key associated with the memory region that includes the memory dement;
determining that the access request is not valid by identifying a page table miss in the page table;
providing, via the memory controller, a response to the access request based on the comparison and a mode of operation; and
determining that the memory element is accessible to a new client; and
updating the memory access key to conform to a new client access key associated with the new client,
wherein the memory controller comprises an encryptor to control a plurality of memory access keys respectively associated with the memory regions;

and wherein the client access key comprises:
at least one of a process identifier, a thread identifier and an application identifier; and
a cyclically changing context definition indicating said at least one of the process identifier, the thread identifier and the application identifier is currently associated with a current status of the memory system.

11. The method of claim 10, wherein the mode of operation is isolation only, and further comprising:
providing unencrypted data to the client upon a determination that the access request is valid, and
providing scrambled data to the client upon a determination that the access request is not valid.

12. The method of claim 10, wherein the mode of operation is encryption and error correction only, and further comprising:
performing encryption and error correction functions, and upon a determination that the access request is not valid, generating an alert that a fatal uncorrectable memory error has occurred.

13. The method of claim 10, further comprising:
identifying an unauthorized access request from a client; and
restricting access to the memory region associated with the unauthorized access request.

14. The method of claim 10, wherein the client access key is unique to each client of a plurality of clients.

15. A programmable memory controller comprising:
a non-transitory computer readable medium that stores configuration data for logic to enable the memory controller to:
control a plurality of memory access keys respectively associated with memory regions of the memory system, wherein each memory region is allocated to a respective client, and wherein the memory access keys are stored in page table attributes of a page table;
receive an access request from a client, wherein the access request includes a client access key to access a memory element corresponding to a virtual address;
determine, in the page table, a physical address corresponding to the virtual address;
look up, from a page table attribute associated with the physical address, a memory access key associated with the physical address;
compare the Ghent access key with the memory access key associated with the memory region that includes the memory element; and
provide a response to the access request based on the comparison and a mode of operation, wherein the mode of operation is one of isolation only, encryption and error correction only, or a combination of isolation, encryption and error correction,
wherein the non-transitory computer readable medium stores configuration data for logic to:
identify a page table miss in the page table;
determine that the access request is not valid based on the identified page table miss, and
wherein the memory controller comprises an encryptor to control a plurality of memory access keys respectively associated with the memory regions;
and wherein the client access key comprises:
at least one of a process identifier, a thread identifier and an application identifier; and
a cyclically changing context definition indicating said at least one of the process identifier, the thread identifier and the application identifier is currently associated with a current status of the memory system.

16. The memory controller of claim 15, wherein the client is an application, and wherein the computer readable medium stores configuration data for logic to:
identify an unauthorized access request from the application; and
generate an interrupt to an operating system to terminate the application.

17. The memory controller of claim 15, wherein the computer readable medium stores configuration data for the logic to further:
determine that the memory element is accessible to a new client; and
update the memory access key to conform to a new client access key associated with the new client, wherein the new client access key is to be subsequently transmitted as part of a subsequent access request and is to be compared to the updated memory access key to determine validity of the subsequent access request.

18. The memory controller of claim 15, wherein the client access key comprises a process identifier, a thread identifier, an application identifier and a context definition.

* * * * *